(12) United States Patent
Wada et al.

(10) Patent No.: US 6,750,393 B2
(45) Date of Patent: Jun. 15, 2004

(54) BACK REFLECTOR OF SOLAR CELLS

(75) Inventors: Kazumi Wada, Lexington, MA (US); Lionel C. Kimerling, Concord, MA (US); Noriaki Toyoda, Hyozo (JP)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/177,040

(22) Filed: Jun. 21, 2002

(65) Prior Publication Data

US 2003/0029496 A1 Feb. 13, 2003

Related U.S. Application Data

(60) Provisional application No. 60/300,681, filed on Jun. 25, 2001.

(51) Int. Cl.[7] .............................................. H01L 31/052
(52) U.S. Cl. ...................... 136/256; 136/259; 136/246; 136/261; 257/432; 257/436; 257/437
(58) Field of Search ................................. 136/256, 259, 136/246, 261; 257/432, 436, 437

(56) References Cited

U.S. PATENT DOCUMENTS 4,918,030 A * 4/1990 Lamb et al. ................. 438/71
5,080,725 A * 1/1992 Green et al. ................ 136/256
6,130,780 A * 10/2000 Joannopoulos et al. ..... 359/584
6,469,682 B1 * 10/2002 de Maagt et al. ........... 343/909

OTHER PUBLICATIONS

Gee, "Optically Enhanced Absorption in Thin Silicon Layers Using Photonic Crystals," 29th IEEE Photovoltaic Specialists Conference, pp. 150–153 (2002).*

Kosaka et al, "Superprism Phenomena in Photonic Crystals: Toward Microscale Lightwave Circuits," Journal of Lightwave Technology, vol. 17, No. 11, pp. 2032–2038, Nov. 1999.*

Baba et al, "Photonic Crystal Light Deflection Devices Using the Superprism Effect," IEEE Journal of Quantum Electronics, vol. 38, No. 7, pp. 909–914, Jul. 2002.*

* cited by examiner

*Primary Examiner*—Alan Diamond
(74) *Attorney, Agent, or Firm*—Gauthier & Connors LLP (57) ABSTRACT

A solar cell that has a photoactive region; a Lambertian surface on the topside of the photoactive region; and a photonic crystal on the backside of the photoactive region.

20 Claims, 10 Drawing Sheets

BACK REFLECTOR OF SOLAR CELLS

PRIORITY INFORMATION

This application claims priority from provisional application Ser. No. 60/300,681 filed Jun. 25, 2001.

BACKGROUND OF THE INVENTION

The invention relates to the field of solar cells, and in particular to thin crystalline silicon solar cells.

Figure 1:
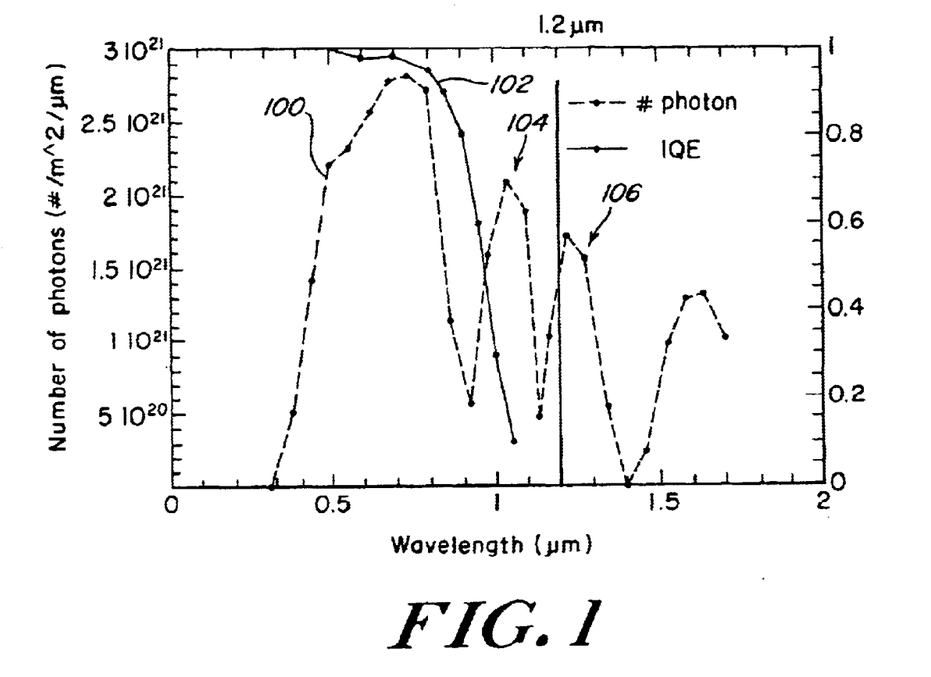
FIG. 1 illustrates the wavelength dependence of internal quantum efficiency (IQE) for thin-film Si cells and the photon number spectrum calculated from the air mass two (AM2) sun spectrum.

Thin crystalline Si solar cells are attractive because they use small volumes of Si material, and they should prove to be cost effective. However, the short optical path length in crystalline Si solar cells reduces the conversion efficiency of photons to carriers. FIG. 1 shows the wavelength dependence of internal quantum efficiency (IQE) for thin-film Si cells (shown by line 102) and the photon number spectrum calculated from the air mass two (AM2) sun spectrum (shown by line 100). As shown, an IQE reduction starts at 0.8 $\mu$m and goes to zero at ~1.1 $\mu$m, despite the fact that photon wavelengths up to 1.2 $\mu$m can yield carrier generation (optical bandgap defined by absorption coefficient $\alpha \sim 10^{-1}$ cm$^{-1}$ at 1.2 $\mu$m).

The photon number spectrum 100 consists of various peaks that survive absorption and scattering in the air. Since the Si optical edge is at 1.2 $\mu$m, photons in roughly half of the second peak 104 as well as the third peak 106 are wasted in thin Si solar cells because of the IQE reduction. This results in a low efficiency for current thin Si solar cells (the best reported one is ~15%, as described in R. Brendel, "*Crystalline Thin-film Silicon Solar Cells from Layer-transfer Processes: a Review*," Proc. 10$^{th}$ Workshop on Crystalline Silicon Solar Cell Materials and Processes, ed. by B. L Sopori, 117, 2000.). The efficiency of thin Si solar cells should at least equal the efficiency of bulk Si solar cells, which is 25%.

To overcome this deficiency in thin Si solar cells, light is typically bounced between the top and bottom surfaces of the solar cell. The current structure to perform this light trapping is the Lambertian top surface and Al backside electrode. The Al electrode has a reflectivity as low as 98%. Assuming that the Lambertian structure has the same internal reflectivity as Al, more than 99% of incident photons escape from cells if they bounce only 100 times between the surfaces. Yet, light with wavelengths near Si's bandgap must be bounced back and forth more than 1000 times to be fully absorbed in current thin Si cells. This is because optical paths 10 cm or longer are required for 1.2 $\mu$m light to be absorbed in Si and generate electron-hole pairs, while current thin Si solar cells are only about 50 $\mu$m thick. Thus, it is very difficult to increase the absorption at near band edge wavelengths (near 1.2 $\mu$m) by using the structure based on the Lambertian surface and Al reflectors.

SUMMARY OF THE INVENTION

The present invention alleviates problems with current light trapping in solar cells by using a photonic crystal as a backside reflector.

Thus, one aspect of the present invention provides for a solar cell that comprises a photoactive region; a Lambertian surface on the topside of the photoactive region; and a photonic crystal on the backside of the photoactive region.

Another aspect of the present invention provides a method of forming a solar cell that comprises forming a Lambertian surface on a topside of a photoactive region; and forming a photonic crystal on a backside of the photoactive region.

DETAILED DESCRIPTION OF THE INVENTION

Figure 2:
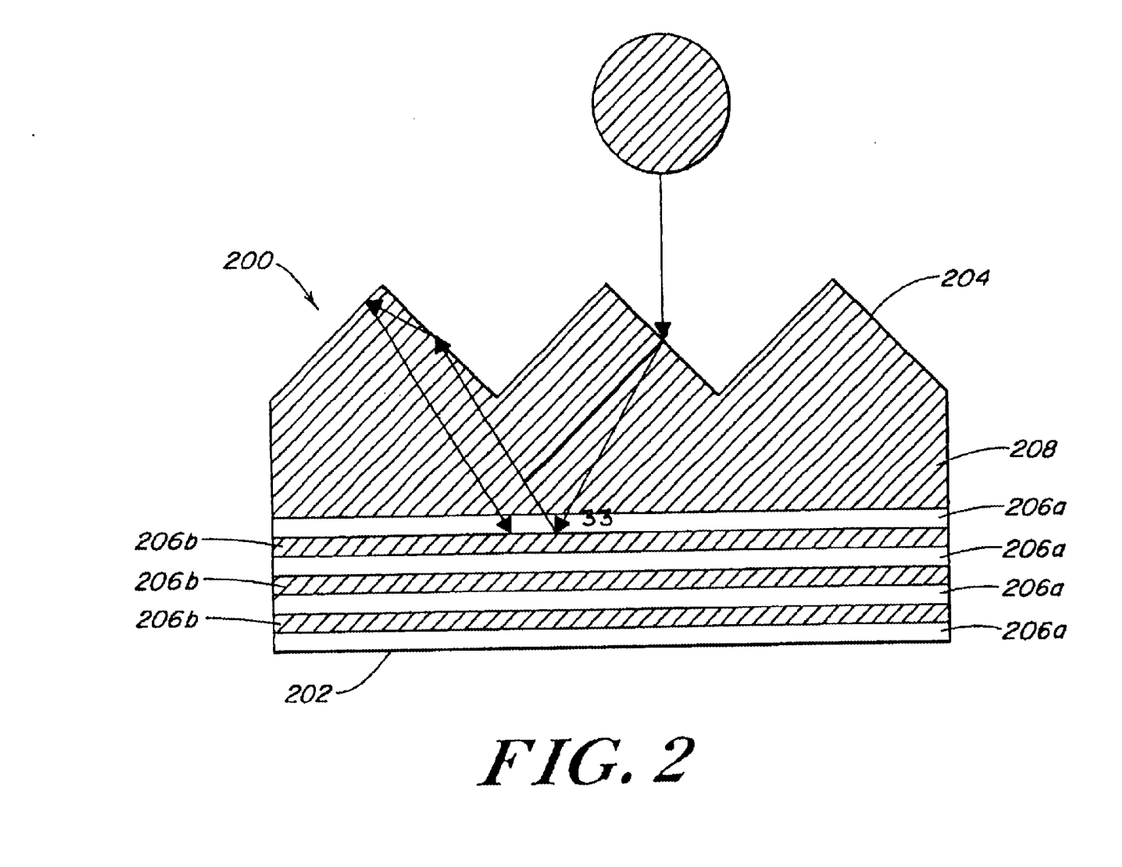
FIG. 2 illustrates a solar cell, according to one embodiment of the present invention, that uses a one-dimensional photonic crystal as a backside reflector.

FIG. 2 illustrates a solar cell 200 according to one embodiment of the present invention. Solar cell 200 is preferably a thin Si solar cell. Solar cell 200 has a photoactive region 208 with a topside Lambertian surface 204 and a backside photonic crystal 202 formed, for example, from alternating dielectric stacks 206a and 206b. Photonic crystals are periodic dielectric structures that have a photonic band gap (PBG) that forbids propagation of a certain frequency range of light. Any incident wave in the frequency range arriving onto the crystal will be reflected rather than transmitted. Photonic crystals are described in more detail in J. D. Joannopoulos, R. D. Meade, J. N. Winn, "Photonic Crystals" (Princeton, 1995). Photonic crystal 202 is a one-dimensional photonic crystal and acts as a "perfect" mirror whose reflectance can be controlled to be more than 99.99%. When dielectric stacks 206a and 206b are made of high index material such as Si (206b) and SiO$_2$ (206a), only four pairs of the layer stacks are needed to realize 99.99% reflectivity.

Figure 3A:
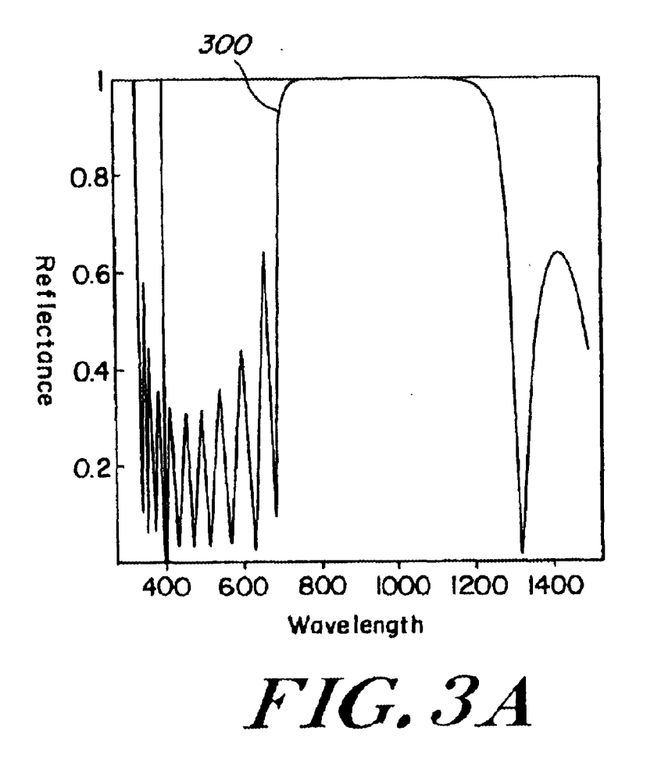
FIGS. 3a–b show the reflectivity of light for a one-dimensional photonic crystal backside reflector made of 3 pairs of Si/SiO$_2$ layer stacks.
Figure 3B:
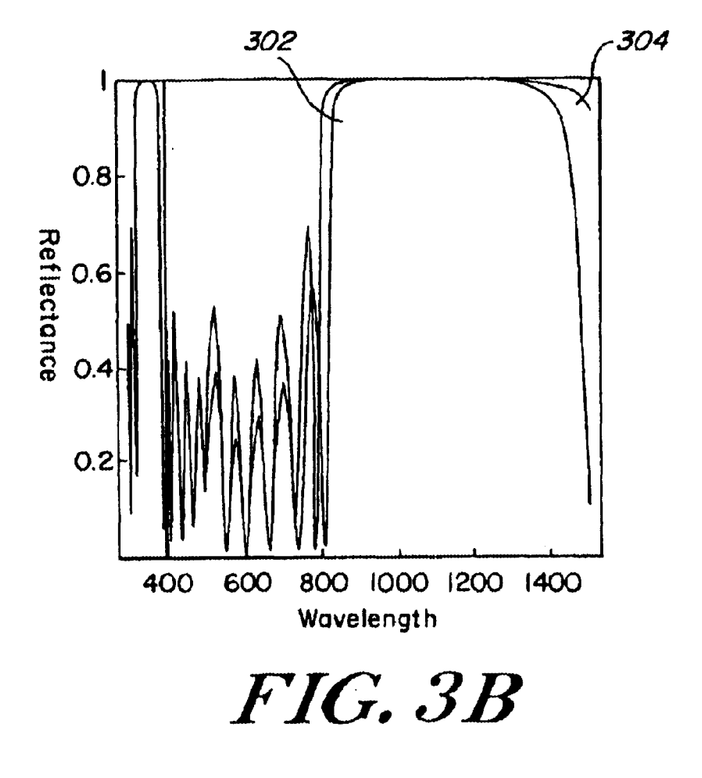

To illustrate the high reflectivity possible, FIGS. 3a–b show the reflectivity of light for a stack made of 3 pairs of Si/SiO$_2$ layer stacks, where the Si is 80 nm thick and the SiO$_2$ is 188 nm thick. FIG. 3a illustrates the reflectivity for light normally incident on the stack, while FIG. 3b illustrates the reflectivity for light incident at 33 degrees. Line 302 is the reflectivity of the TM mode and line 304 is the reflectivity of the TE mode.

Increasing the backside reflectivity reduces the number of photons lost during light reflection. This allows light to be bounced back and forth more than 100 times before 99% of the photons are lost, which allows more light with longer wavelengths to be absorbed.

However, even using a highly reflective photonic crystal 202, light will not likely be bounced back and forth more than a thousand times without leakage because the topside Lambertian surface 204 has a low reflectivity of ~98%. Leakage resulting from this low reflectivity reduces the number of photons by nearly 90% for light that has bounced 100 times.

Figure 4A:
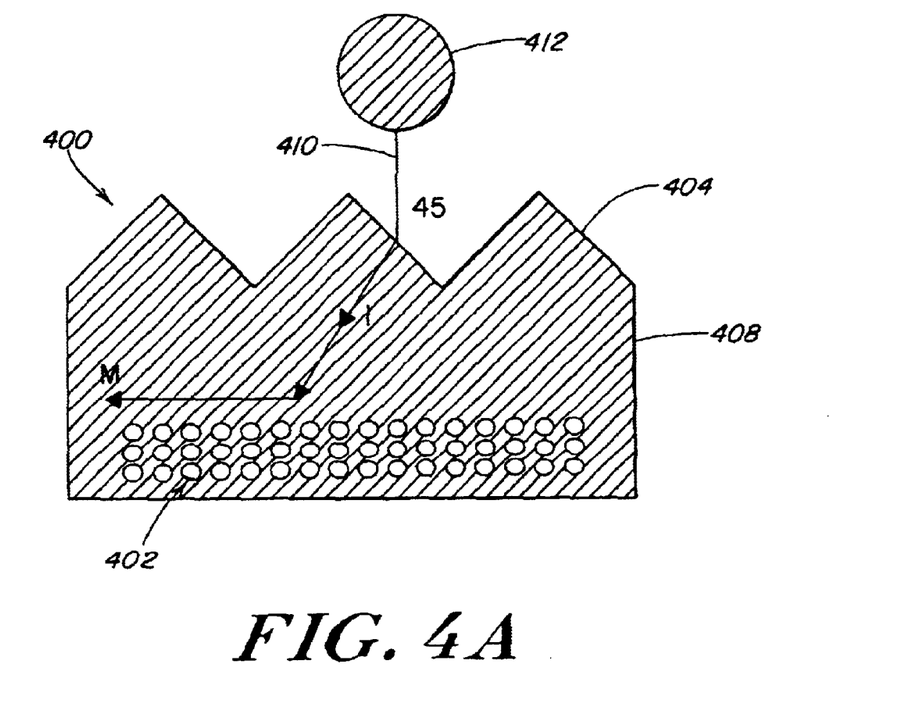
FIG. 4a illustrates a solar cell, according to another embodiment of the present invention, that uses a photonic crystal superprism as a backside reflector.

Accordingly, another embodiment of the present invention uses a photonic crystal superprism as a backside reflector to increase the propagation path length of reflected light. A photonic crystal superprism is a photonic crystal with an incomplete photonic bandgap that provides for a large angle refraction of incident light, i.e. it is a directional reflector. FIG. 4a illustrates a solar cell 400 according to this embodiment. Solar cell 400 is preferably a thin Si solar cell. As shown, solar cell 400 has a photoactive region 408 with a topside Lambertian surface 404 and a backside photonic crystal superprism 402. Superprism 402 and Lambertian surface 404 are designed so that normal incident light 410 (e.g., from the sun 412) is refracted with a momentum parallel to superprism 402 (along the cell plane). This allows it to travel a longer path in solar cell 400.

Figure 4B:
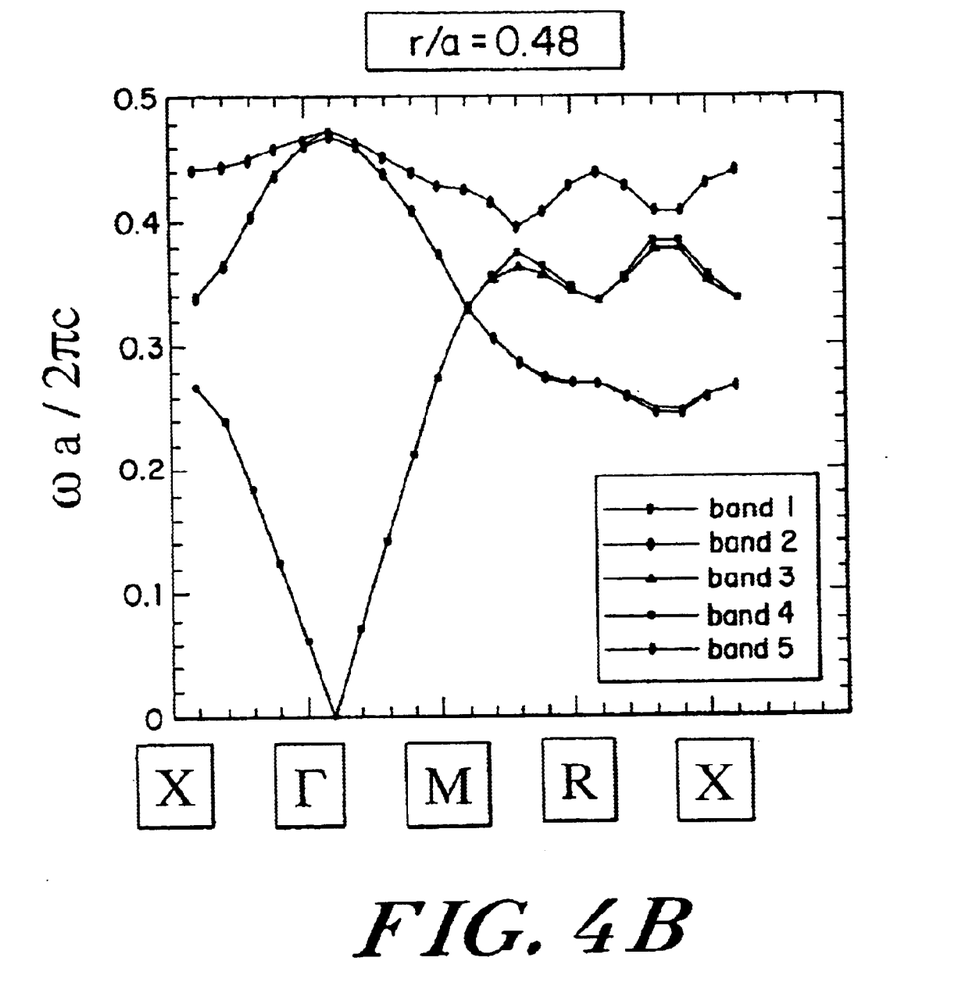
FIG. 4b illustrates the theoretical band diagram of a 3-dimensional photonic crystal formed from a square lattice of air voids for a ratio of air void radius r to periodicity a equal to 0.48.

In one embodiment, superprism 402 is a 3-dimensional photonic crystal formed from a cubic lattice of air voids. FIG. 4b shows the theoretical band diagram of such a photonic crystal for a ratio of air void radius r to periodicity a equal to, for example, 0.48, i.e. r/a=0.48. As can be seen, no photonic state exists except the M valleys for photons with normalized frequencies $\omega a/2\pi c$ between 0.27 and 0.33. The M valleys correspond to four equivalent diagonal directions in the square lattice in real space. Thus, the only allowed propagation direction is along the diagonal directions in the square lattice. That is, incident light with a normalized frequency between 0.27 and 0.33 that is propagating normal to the superprism's (100) lattice plane or in the ΓX direction will be defracted, while light propagating in the ΓM direction will be directed along one of the diagonal directions. The frequency range over which this occurs can be adjusted by changing the periodicity a of the air voids.

The light incident $\lambda$ on superprism 402 should be at a slight angle so that some component is propagating in the ΓM direction. This small angle of incidence naturally occurs when normal incident light 410 passes through Lambertian surface 404. The light will then be directed along one of the diagonal directions as long as the angle has a component in the ΓM direction. Which M valley the refracted light follows depends on the initial light momentum, i.e. its incident angle to superprism 402.

Thus, the combined Lambertian surface 404 and superprism 402 causes the momentum of incident light 410 to be directed parallel to the cell plane. Because the length of a solar cell is typically longer than its thickness, this increases the propagation length of the light, which allows longer wavelengths to be absorbed without sizable losses from leakage. For instance, in current technology the distance in the direction of the M valleys is typically 10 cm for 4 inch wafers, which is equivalent to the absorption length in Si for 1.2 $\mu$m wavelength light.

Figure 5:
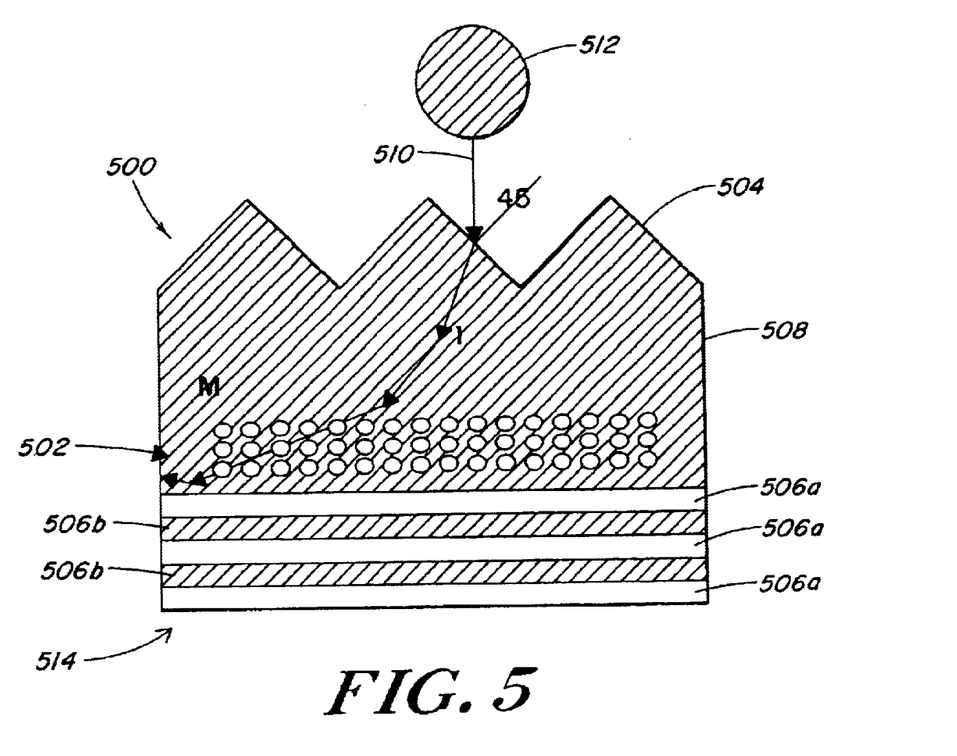
FIG. 5 illustrates another embodiment of a solar cell according to the present invention that combines the embodiments of FIGS. 2 and 3.

FIG. 5 illustrates another embodiment of a solar cell 500 according to the present invention that combines the embodiments of FIGS. 2 and 3. Solar cell 500 is preferably a thin Si solar cell. As shown, solar cell 500 has a photoactive region 508 with a topside Lambertian surface 504. A superprism 502 is formed, for example, as a 3-dimensional photonic crystal formed from a cubic lattice of air voids. A photonic crystal 514 is formed under first superprism 502 from, for example, alternating dielectric stacks 506a and 506b.

In general, superprism 502 directs light both inward (along the diagonals internal to superprism 502) and outward (along the diagonals leading out of superprism 502). As shown, photonic crystal 514 reflects some of the light that is directed outward back into superprism 502.

Figure 6:
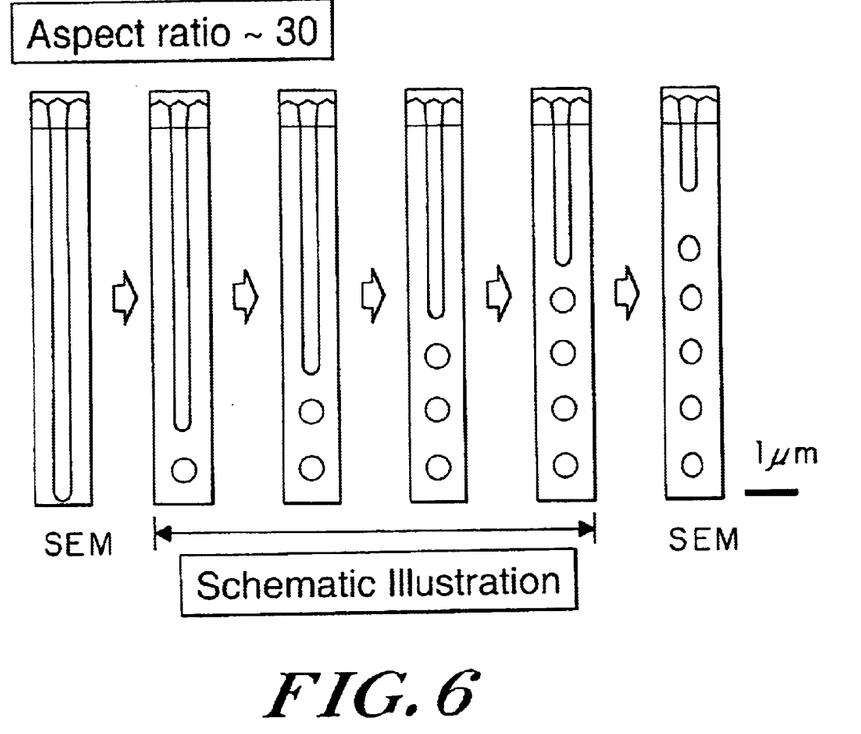
FIG. 6 illustrates one method of forming a void array in silicon.

A number of techniques can be used to form the superprism. One method is to transform a deep via-hole to a void array as described by Mizushima et al. in "*Empty-space-in-silicon Technique for Fabricating a Silicon-on-nothing Structure*," Appl. Phys. Lett. 77, 3290, 2000, which is incorporated herein by reference. FIG. 6 shows this technology for the void array formation.

The via-hole array is fabricated by plasma etching a trench 600, whose aspect ratio is about 30. Then the trench structure is annealed at 1100° C. for 10 min in $H_2$ ambient. As illustrated in FIG. 6, the via-hole structure transforms to a void array. This is due to minimization of surface energy with the aid of high surface diffusivity of Si under $H_2$ ambient. The radius r and periodicity a of the voids are controlled by the radius and aspect ratio of via-holes and annealing temperatures.

As previously described, the band diagram illustrated in FIG. 5 was obtained for r/a=0.48. From this, the diameter and period of the voids is calculated to be 0.34 and 0.36 $\mu$m, respectively, in order for the structure of FIG. 6 to act as the superprism for a 1.2 $\mu$m wavelength. For a ratio between the voids and the via-holes in size of 1.88 (as described in Mizushima et al.), the via-holes should be 0.2 $\mu$m in diameter with periodicity of 0.36 $\mu$m. Because of the large index difference (2.5) between air and Si, 4 voids in depth are enough to realize a reflectivity of 99.99%. Thus, the via-holes could be as shallow as 2 $\mu$m in depth. In other words, the aspect ratio needed is only 10.

In this structure, the void inner surface acts as a non-radiative recombination center if it is not properly passivated. Thus, passivation of the void inner surface helps increase the charge collection efficiency. This can be done by internal oxidation, as described in T. Saito et al. "*Microstructure Transformation of Silicon: A Newly Developed Transformation Technology for Patterning Silicon Surfaces using the Surface Migration of Silicon Atoms by Hydrogen Annealing*," Jpn. J. of Appl. Phys. 39, 5033, 2000, incorporated herein by reference. The interface states between Si and $SiO_2$ should be very low for a grown oxide.

Figure 7:
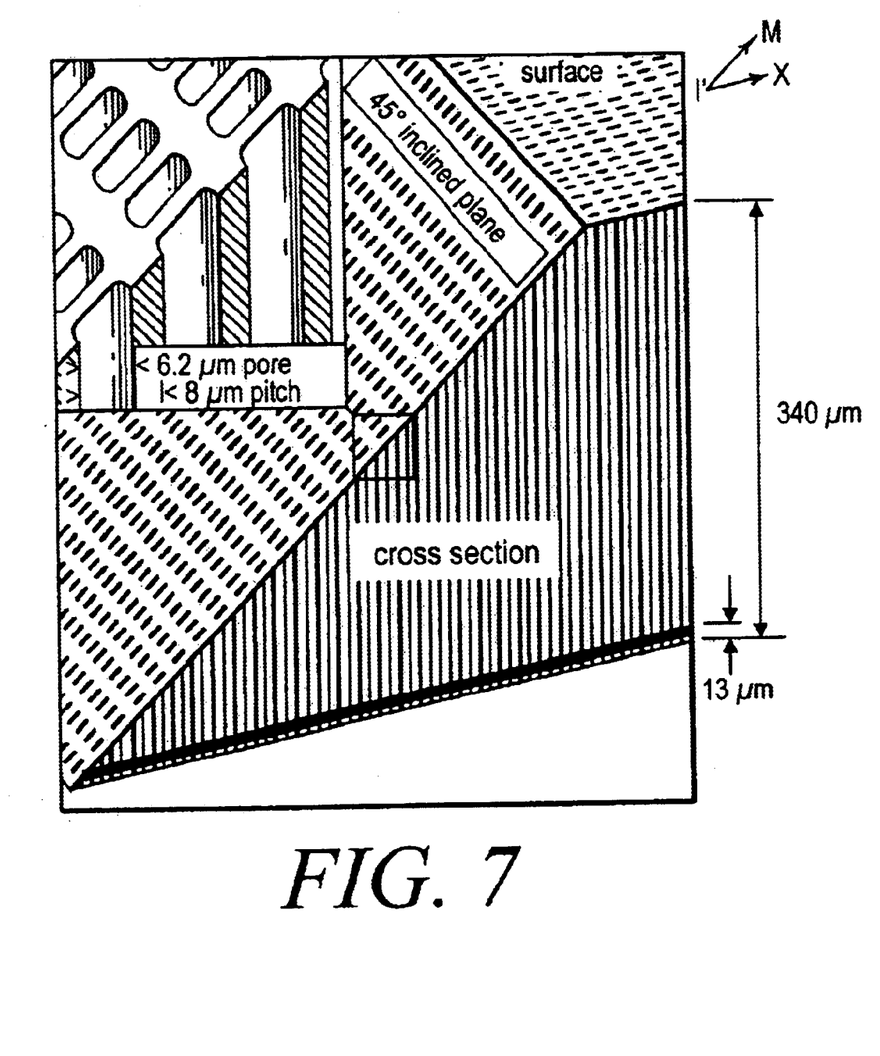
FIG. 7 illustrates a well aligned porous Si microstructure.

Another method for fabricating a via-hole array for a superprism is to use electrochemical reactions, or anodic oxidation to form porous Si. This is then followed by hydrogen annealing to form the air voids. Grunging, et al. recently showed well aligned porous Si in "*Two-dimensional Infrared Photonic Bandgap Structure Based on Porous Silicon*," Appl. Phys. Lett. 66, 3254, 1995, incorporated herein by reference. This microstructure is shown in FIG. 7. The via hole dimensions shown are too large, but finer structures are possible by varying doping and current density during anodic oxidation.

Also, the superprism can be fabricated by forming porous silicon with a periodic index variation along the pores resulting from a periodic variation of the pore diameter with pore depth. A technique for forming such porous silicon is described in Schilling et al., "*Three-dimensional Photonic Crystals based on Macroporous Silicon with Modulated Pore Diameter*," Appl. Phys. Lett. 78, 1180, 2001, which is incorporated herein by reference. Schilling et al. achieve the periodic variation of pore diameter with pore depth by periodically modulating backside illumination (and consequently etch current) while the pores grow into the substrate.

Figure 8:
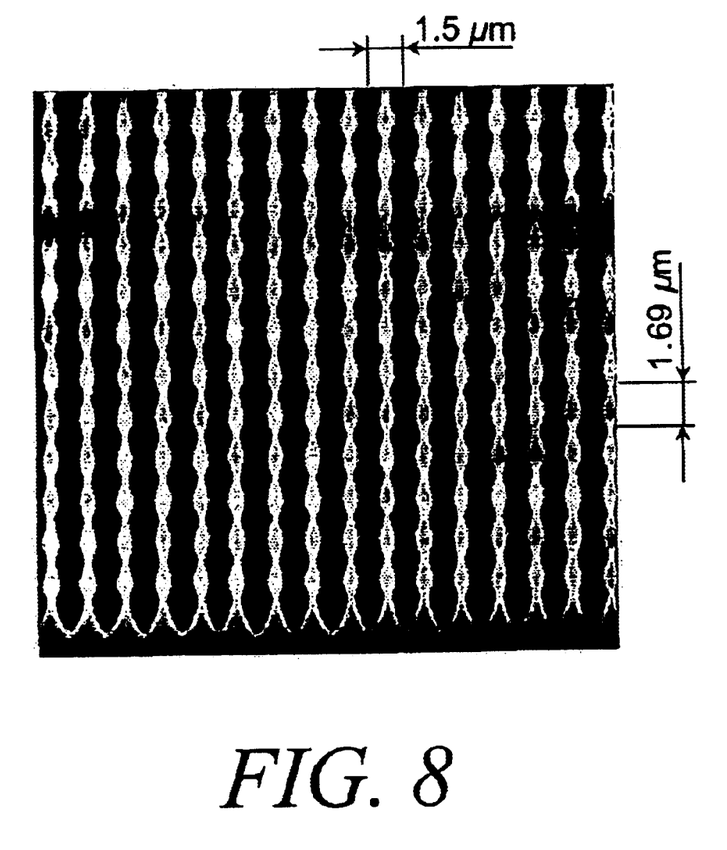
FIG. 8 illustrates porous silicon with a periodic variation of the pore diameter with pore depth.

FIG. 8 illustrates a modulated pore structure resulting from the technique of Schilling et al.

Figure 9:
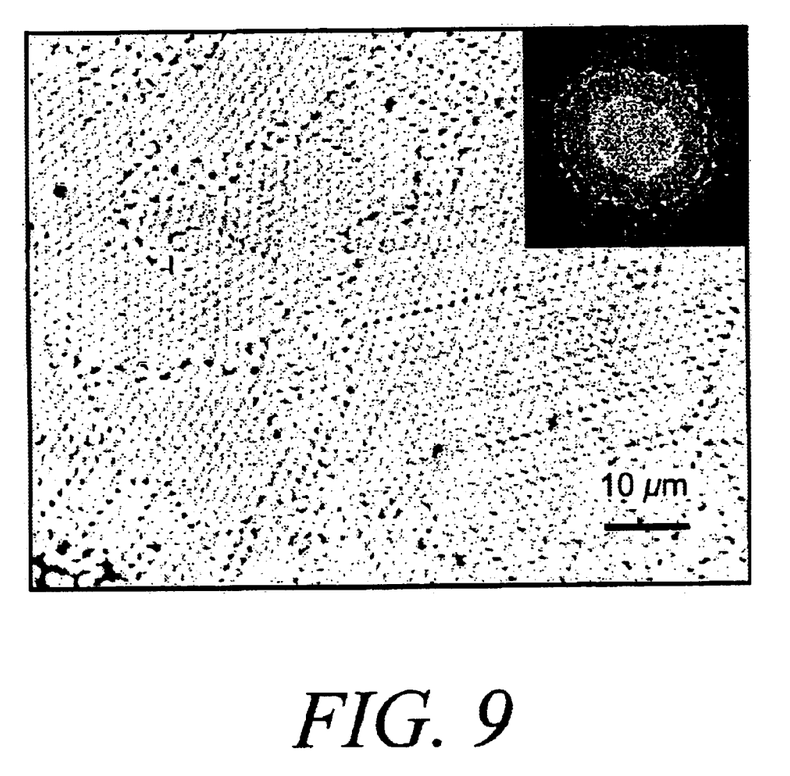
FIG. 9 illustrates electro-statically self-assembled SiO$_2$ microspheres.

Another method of forming a superprism uses electro-statically self-assembled opal. It is known that opal consists of $SiO_2$ spheres in a photonic crystal array with an incomplete PBG. Thus, fabrication of electro-statically self-assembled $SiO_2$ microspheres, opal, can also be used to form a superprism. FIG. 9 illustrates such self-assembled microspheres. A superprism with a wider PBG can also be realized by replacing $SiO_2$ spheres with oxided Si spheres.

Although the present invention has been shown and described with respect to several preferred embodiments thereof, various changes, omissions and additions to the form and detail thereof, may be made therein, without departing from the spirit and scope of the invention.

What is claimed is:

1. A solar cell comprising:
   a photoactive region with a top and a bottom;
   a Lambertian surface on the top of the photoactive region; and
   a photonic crystal on the bottom of the photoactive region, wherein said photonic crystal comprises a superprism.

2. The solar cell according to claim 1, wherein the superprism is formed from a cubic lattice of air voids.

3. The solar cell according to claim 2, wherein the solar cell is a thin silicon solar cell.

4. The solar cell according to claim 3, wherein the cubic lattice of air voids is formed by hydrogen annealing of etched trenches.

5. The solar cell according to claim 3, wherein the cubic lattice of air voids is formed by hydrogen annealing of porous silicon.

6. The solar cell according to claim 1, wherein the superprism is formed from electro-statically self-assembled microspheres of $SiO_2$ or oxided Si.

7. The solar cell according to claim 1, wherein the superprism is fabricated by forming porous silicon with a periodic index variation along the pores resulting from a periodic variation of the pore diameter with pore depth.

8. A method of forming a solar cell comprising:
   forming a Lambertian surface on a top of a photoactive region; and
   forming a photonic crystal on a bottom of the photoactive region, wherein said photonic crystal comprises a superprism.

9. The method according to claim 8, wherein the superprism is formed from a cubic lattice of air voids.

10. The method according to claim 9, wherein the solar cell is a thin silicon solar cell.

11. The method according to claim 10, wherein the cubic lattice of air voids is formed by hydrogen annealing of etched trenches.

12. The method according to claim 10, wherein the cubic lattice of air voids is formed by hydrogen annealing of porous silicon.

13. The method according to claim 8, wherein the superprism is formed from electro-statically self-assembled microspheres of $SiO_2$ or oxided Si.

14. The method according to claim 8, wherein the superprism is fabricated by forming porous silicon with a periodic index variation along the pores resulting from a periodic variation of the pore diameter with pore depth.

15. A thin silicon solar cell comprising:
    a photoactive region;
    a Lambertian surface on top of the photoactive region; and
    a superprism on a bottom of the photoactive region;
    wherein light that is normally incident on the Lambertian surface is directed by the superprism so as to have momentum parallel to the superprism.

16. The solar cell according to claim 15, wherein the superprism is formed from a cubic lattice of air voids.

17. The solar cell according to claim 16, wherein the cubic lattice of air voids is formed by hydrogen annealing of etched trenches.

18. The solar cell according to claim 16, wherein the cubic lattice of air voids is formed by hydrogen annealing of porous silicon.

19. The solar cell according to claim 15, wherein the superprism is formed from electro-statically self-assembled microspheres of $SiO_2$ or oxided Si.

20. The solar cell according to claim 15, wherein the superprism is fabricated by forming porous silicon with a periodic index variation along the pores resulting from a periodic variation of the pore diameter with pore depth.

* * * * *